United States Patent
Naaman et al.

(10) Patent No.: US 10,540,603 B2
(45) Date of Patent: Jan. 21, 2020

(54) RECONFIGURABLE QUANTUM ROUTING

(71) Applicants: Ofer Naaman, Ellicott City, MD (US); Zachary Kyle Keane, Baltimore, MD (US); Micah John Atman Stoutimore, Kensington, MD (US); David George Ferguson, Takoma Park, MD (US)

(72) Inventors: Ofer Naaman, Ellicott City, MD (US); Zachary Kyle Keane, Baltimore, MD (US); Micah John Atman Stoutimore, Kensington, MD (US); David George Ferguson, Takoma Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/012,543

(22) Filed: Jun. 19, 2018

(65) Prior Publication Data

US 2019/0385088 A1 Dec. 19, 2019

(51) Int. Cl.
*G06N 10/00* (2019.01)
*H04B 10/70* (2013.01)
(Continued)

(52) U.S. Cl.
CPC ......... *G06N 10/00* (2019.01); *G01R 33/0358* (2013.01); *H04B 10/70* (2013.01);
(Continued)

(58) Field of Classification Search
None
See application file for complete search history.

(56) References Cited

U.S. PATENT DOCUMENTS

| 4,437,075 A | 3/1984 | Darmouni |
| 4,800,345 A | 1/1989 | Podell |

(Continued)

FOREIGN PATENT DOCUMENTS

| EP | 2730029 A2 | 5/2014 |
| EP | 3254375 A1 | 12/2017 |

(Continued)

OTHER PUBLICATIONS

Wendin, G. "Quantum Information Processing with Superconducting Circuits: a Review." Reports on Progress in Physics, vol. 80, No. 10, 2017, p. 106001., doi:10.1088/1361-6633/aa7ela. (Year: 2017).*

(Continued)

*Primary Examiner* — J. E. Schoenholtz
(74) *Attorney, Agent, or Firm* — Tarolli, Sundheim, Covell & Tummino LLP

(57) ABSTRACT

Real-time reconfigurability of quantum object connectivity can be provided with one or more quantum routers that can each be configured as either or both of a single-pole double-throw switch and a cross-point switch. The quantum router includes variable-inductance coupling elements in RF-SQUIDs having inductors transformer-coupled to two control flux lines, one providing a static current and the other providing a dynamic current, the direction of which can be toggled to couple or uncouple quantum objects, such as qubits, based on the dynamic current direction to provide reconfigurable quantum routing.

20 Claims, 7 Drawing Sheets

(51) Int. Cl.
  *H04L 12/933* (2013.01)
  *G01R 33/035* (2006.01)
  *H04Q 3/52* (2006.01)
  *H01P 1/15* (2006.01)
(52) U.S. Cl.
  CPC ........... *H04L 49/101* (2013.01); *H04Q 3/523* (2013.01); *H01P 1/15* (2013.01)

(56) References Cited

U.S. PATENT DOCUMENTS

| | | | |
|---|---|---|---|
| 5,294,884 | A | 3/1994 | Goto et al. |
| 5,818,308 | A | 10/1998 | Tanaka |
| 6,346,863 | B2 | 2/2002 | Sasaki |
| 6,407,647 | B1 | 6/2002 | Apel |
| 6,636,126 | B1 | 10/2003 | Pozdeev |
| 6,747,525 | B2 | 6/2004 | Iida |
| 6,765,455 | B1 | 7/2004 | De Lillo |
| 6,806,558 | B2 | 10/2004 | Apel |
| 7,969,178 | B2 | 6/2011 | Przybysz et al. |
| 8,957,699 | B2 | 2/2015 | Eastin |
| 9,257,736 | B1 | 2/2016 | Josypenko |
| 9,461,588 | B1 | 10/2016 | Naaman et al. |
| 9,501,748 | B2 | 11/2016 | Naaman et al. |
| 9,647,662 | B1 | 5/2017 | Abutaleb et al. |
| 9,768,771 | B2 | 9/2017 | Naaman |
| 9,928,948 | B2 | 3/2018 | Naaman et al. |
| 10,042,805 | B2 | 8/2018 | Naaman et al. |
| 2003/0218516 | A1 | 11/2003 | Gilbert |
| 2004/0189388 | A1 | 9/2004 | Nguyen |
| 2006/0147154 | A1 | 7/2006 | Thom et al. |
| 2006/0220737 | A1 | 10/2006 | Sanderson |
| 2008/0048762 | A1 | 2/2008 | Inamdar et al. |
| 2009/0189712 | A1 | 7/2009 | Jiang |
| 2010/0148853 | A1 | 6/2010 | Harris et al. |
| 2010/0164649 | A1 | 7/2010 | Toncich et al. |
| 2011/0054876 | A1 | 3/2011 | Biamonte et al. |
| 2014/0235450 | A1* | 8/2014 | Chow ............... H01L 39/00 505/170 |
| 2015/0254571 | A1 | 9/2015 | Miller et al. |
| 2016/0233860 | A1* | 8/2016 | Naaman ............... H03K 17/92 |
| 2016/0335558 | A1 | 11/2016 | Bunyk et al. |
| 2016/0335560 | A1 | 11/2016 | Mohseni et al. |
| 2017/0062107 | A1 | 3/2017 | Naaman et al. |
| 2017/0104695 | A1 | 4/2017 | Naaman |
| 2017/0201224 | A1 | 7/2017 | Strong |
| 2017/0212860 | A1 | 7/2017 | Naaman et al. |
| 2017/0286859 | A1 | 10/2017 | Harris et al. |
| 2019/0007051 | A1 | 1/2019 | Sete et al. |

FOREIGN PATENT DOCUMENTS

| | | |
|---|---|---|
| JP | 2013-058705 A | 3/2013 |
| JP | 5363993 B2 | 12/2013 |
| WO | 9836467 | 8/1998 |
| WO | 2014028302 A2 | 2/2014 |
| WO | 20160126981 A1 | 8/2016 |
| WO | 2017062143 A1 | 4/2017 |
| WO | 2017/111949 | 6/2017 |
| WO | 2017127205 A1 | 7/2017 |
| WO | 2017022806 A1 | 11/2017 |
| WO | 2017/222806 | 12/2017 |

OTHER PUBLICATIONS

Australian Search Report corresponding to Australian Patent Application No. 2016388350, dated Jan. 7, 2019.
Chen, Y. et al., "Qubit architecture with high coherence and fast tunable coupling," Department of Physics and Astronomy, University of California and University of Georgia. arXiv:1402.7367v1 [cond-mat.supr-con], dated Feb. 28, 2014.
Eastin, B. "Distilling one-qubit magic states into Toffoli states," Northrop Grumman Corporation. arXiv:1212.4872v2 [quant-ph]. Dated Feb. 22, 2013.
Majer, J. et al., "Coupling Superconducting Qubits via a Cavity Bus," Departments of Applied Physics and Physics, Yale University and ETH Zurich Switzerland. arXiv:0709.2135v1 [cond-mat.meshall]. Dated Sep. 13, 2007.
Srinivasan, S.J. et al., "Tunable Coupling in Circuit Quantum Electrodynamics Using a Superconducting Charge Qubit with a V-Shaped Energy Level Diagram," American Physical Society. PRL 106, 083601 (2011). Dated Feb. 25, 2011.
International Search Report corresponding to International application No. PCT/US2019/012068 dated Mar. 25, 2019.
Written Opinion and Search Report corresponding to International Application No. PCT/US2019/014796 dated Apr. 26, 2019.
Anonymous: "What is the self-resonant frequency of a capacitor", May 22, 2017, XP055582197,Retrieved from the Internet:URL:https://www.quora.com What-is-the-self-resonant-frequency-of-a-capacitor[retrieved on Apr. 17, 2019] the whole document.
Tuori et al: "Efficient protocol 1-20 for qubit initialization with a tunable environment", ARXIV .ORG, Cornell University LI BRA RY, 201 Olin Library Cornell University Ithaca, NY 14853, Dec. 13, 2016 (Dec. 13, 2016), XP080743892,DOI: 10.1038/S41534-017-0027-1 abstract; figures 1-6 p. 1, line 1—p. 6, last line p. 8, line 1—p. 11, last line p. 13, line 10—p. 16, last line.
Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1—p. 4,right-hand column, last line.
Kafri: "Tunable inductive coupling of superconducting qubits in the Srongly nonlinear regime",arXiv:1606.08382v2, Jan. 23, 2017 (Jan. 23, 2017), xP055469297,Retrieved from the internet:URL:https://arxiv.orgabs1606.08382v2[retrieved on Apr. 20, 2018]abstract; figures 1-3 p. 1, line 1—p. 22, last line.
Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA. 90.062333 abstract; figures 1-4 p. 1, Left-hand column, line 1—p. 4,right-hand column, line 25.
Canadian Office Action Corresponding to Canadian Application No. 2,987,426 dated Apr. 8, 2019.
Final Office Action for U.S. Appl. No. 15/868,557 dated Jul. 25, 2019.
Japanese Office Action for Application No. 2018-533894 dated Aug. 20, 2019.
Non Final Office Action for U.S. Appl. No. 15/866,602 dated Aug. 21, 2019.
Non Final Office Action for U.S. Appl. No. 16/255,588 dated Sep. 5, 2019.
Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.
Ehara, et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.
International Search Report from corresponding PCT/US2019/012065, dated May 17, 2019.
International Search Report from corresponding PCT/US2019/018497; dated May 15, 2019.
LU: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.
Rafique et al.: Tunable filter based DC-SQUID chain 1; May 1, 2007 (May 1, 2007), pp. 1-2, XP055585121, DOI: 10.13140/RG.2.1. 1612.5688, Retrieved from the Internet: URL:https://www.researchgate. net/profile/RaihanRafique2/publication/305769905 Tunable filter based

(56) References Cited

OTHER PUBLICATIONS on DC SQUID chain/links/57 a07d4408ae94f454eb0968/Tunable-filter-based-on-DC-SQUID-chain.pdf [retrieved on May 2, 2019].
Tuorila et al: "Efficient protocol for qubit initialization with a tunable environment", ARXIV.ORG, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1—p. 7, last line.
Ferguson et al.: "Non-stoquastic XX couplers for superconducting flux qubits", Abstract submitted to the APS Mar. Meeting 2017 (to be held Mar. 13, 2017), Jan. 4, 2017 (Jan. 4, 2017), XP055469302, Retrieved from the Internet: URL :http ://absimage.aps.org/image/MAR17/MWSMAR17-2016-008291.pdf. [retrieved on Apr. 18, 2018] abstract.
G.Samach et al: Coupled qubits for next generation quantum annealing: novel interactions 11, Abstract submitted to the APS Mar. Meeting 2017 (to be held Mar. 13, 2017), Jan. 4, 2017 (Jan. 4, 2017), XP055469301, Retrieved from the Internet: URL:http://absimage.aps.org/image/MAR17/MWS MAR17-2016-003302.pdf [retrieved on Apr. 20, 2018] abstract.
International Search Report corresponding to International Application No. PCT/US2018/015729, dated May 2, 2018.
Lanting et al.: 11 Cotunneling in pairs of coupled flux qubits, Physical Review B, vol. 82, 060512R, Aug. 23, 2010 (Aug. 23, 2010), XP055469296, figures I(a)&(b).

\* cited by examiner

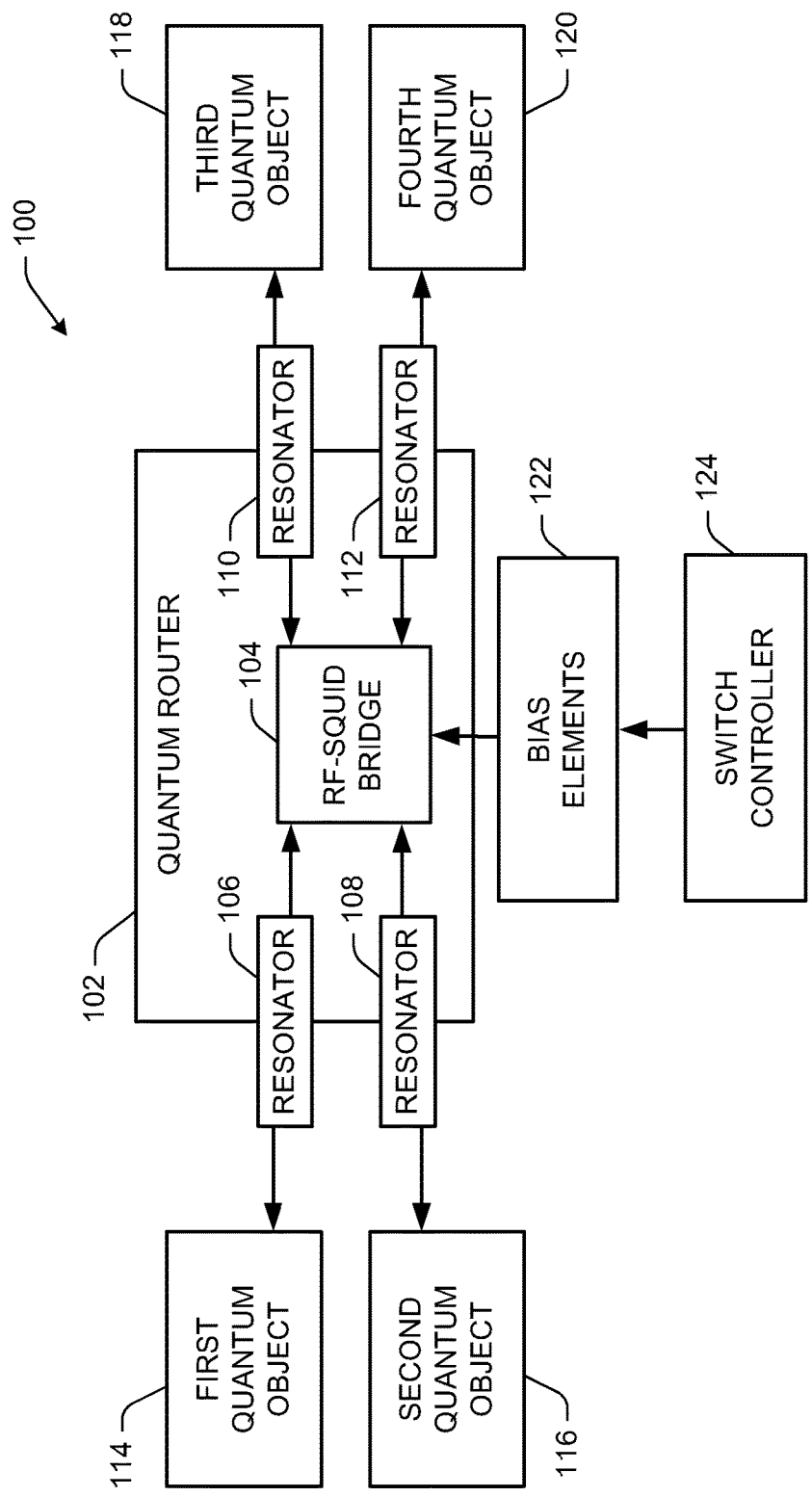
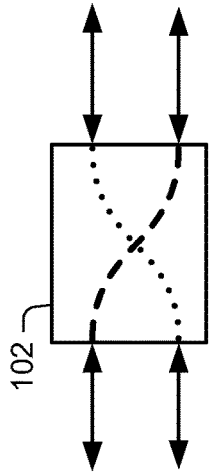
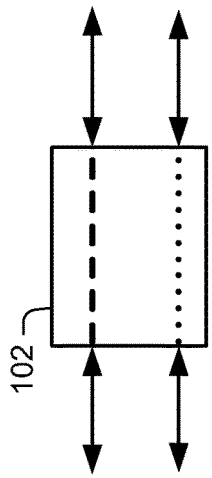
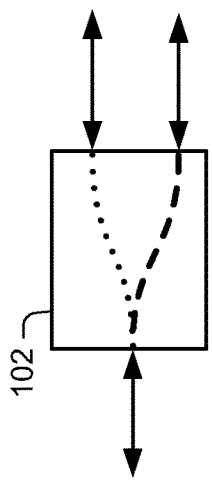

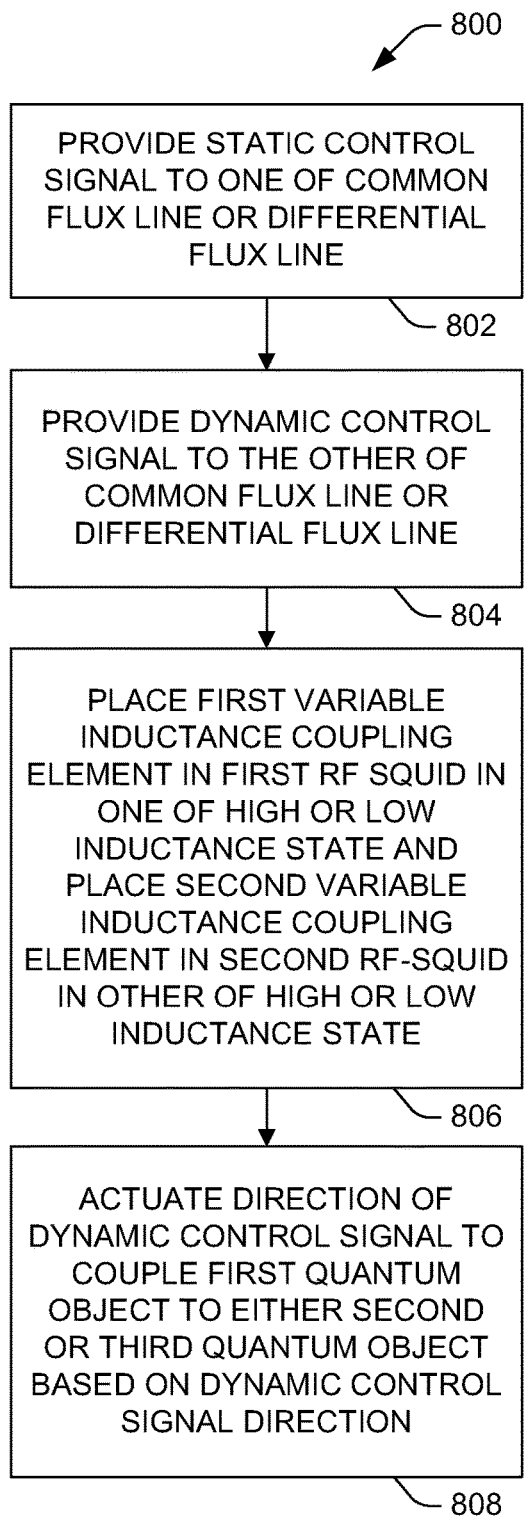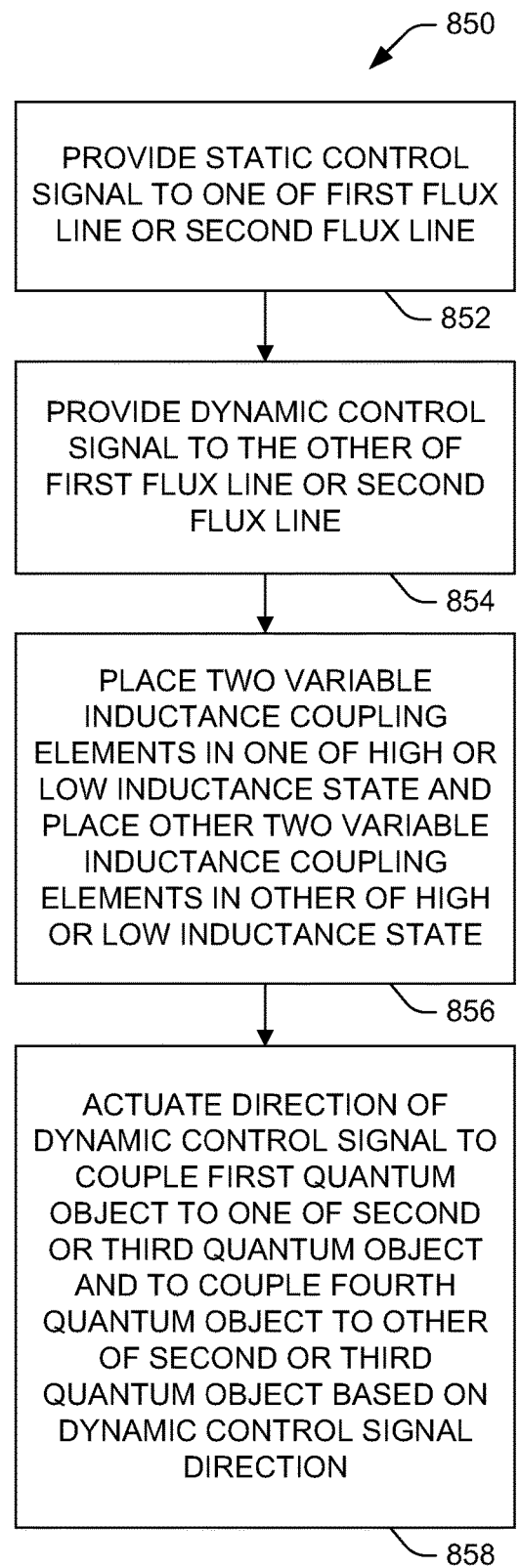
FIG. 8A
FIG. 8B

US 10,540,603 B2

RECONFIGURABLE QUANTUM ROUTING

GOVERNMENT LICENSE RIGHTS

This invention was made with Government support under Contract No. 30059298. The government has certain rights in this invention.

TECHNICAL FIELD

The present invention relates generally to quantum and classical digital superconducting circuits, and specifically to reconfigurable quantum routing.

BACKGROUND

A fundamental challenge for quantum computation and simulation is to construct a large-scale system of highly connected coherent qubits to perform various operations. Superconducting qubits utilize macroscopic circuits to process quantum information and are a promising candidate towards this end. Recently, materials research and circuit optimization has led to significant progress in qubit coherence. Superconducting qubits can now perform hundreds of operations within their coherence times, allowing for research into complex algorithms such as error correction. In many applications, it is desirable to combine these high-coherence qubits with tunable inter-qubit coupling, since it would allow for both coherent local operations and dynamically varying qubit interactions. For quantum computation, this would provide isolation for single-qubit gates while at the same time enabling fast two-qubit gates that minimize errors from decoherence.

SUMMARY

One example includes a reconfigurable quantum router system. The system includes first, second, and third quantum objects respectively connected to first, second, and third ports of a quantum router. The quantum router includes two variable-inductance coupling elements each in an RF-SQUID, at least two of the variable-inductance coupling elements being connected to at least one shared inductor such that their respective RF-SQUIDs share the inductor in common. The quantum router further includes first and second control flux lines, wherein one of the flux control lines is configured to inductively provide a static current to at least two of the variable-inductance coupling elements and the other of the control flux lines is configured to provide a dynamic current to at least two of the variable-inductance coupling elements. The quantum router further includes first, second, and third resonators by which the first, second, and third quantum objects are respectively each connected to at least one of the RF-SQUIDs, such that each quantum object can be placed arbitrarily distantly from the RF-SQUIDs on a chip. Actuation of the direction of the dynamic current couples at least the first quantum object to only one of the first or second quantum objects based on the dynamic current direction to provide reconfigurable quantum routing.

Another example includes a method of reconfigurable quantum routing. A static control signal is provided to one of a first flux line that is inductively coupled to two RF-SQUIDs via at least one common inductor to induce a current split between variable inductance coupling elements in respective ones of the RF-SQUIDs, or a second flux line that is inductively coupled to at least two RF-SQUIDs via other inductors in each of them. A dynamic control signal is provided to the other of the first flux line or the second flux line, such that the difference between induced common flux current and induced dynamic flux current places at least one of the variable inductance coupling elements in one of a high or low inductance state and places at least another of the variable inductance coupling elements in the other of the high or low inductance state. The direction of the dynamic control signal is actuated to couple at least a first quantum object (e.g., a qubit) to only one of at least two other quantum objects, based on the dynamic control signal direction.

Yet another example includes a reconfigurable quantum router. The quantum router includes first, second, and third ports each coupleable to a respective qubit, and first, second, and third resonators each respectively connected between the first, second, and third ports and an RF-SQUID bridge. The RF-SQUID bridge includes a first Josephson junction connected between the first resonator and the second resonator, and a second Josephson junction connected between the first resonator and the third resonator. First and second flux lines are arranged to switch the inductance of the Josephson junctions between high and low inductance states to selectively couple or uncouple qubits connected to the ports.

BRIEF DESCRIPTION OF THE DRAWINGS

FIG. 1A is a block diagram of an example reconfigurable quantum router system.

FIG. 1B is a diagram showing both of two alternate routing states of a first example reconfigurable quantum router.

FIG. 1C is a diagram showing a first of two alternate routing states of a second example reconfigurable quantum router (a "bar" state).

FIG. 1D is a diagram showing a second of two alternate routing states of the second example reconfigurable quantum router (a "cross" state).

FIGS. 8A, 8B, and 8C are flow charts illustrating example methods of reconfigurable quantum routing.

DETAILED DESCRIPTION

Figure 2:
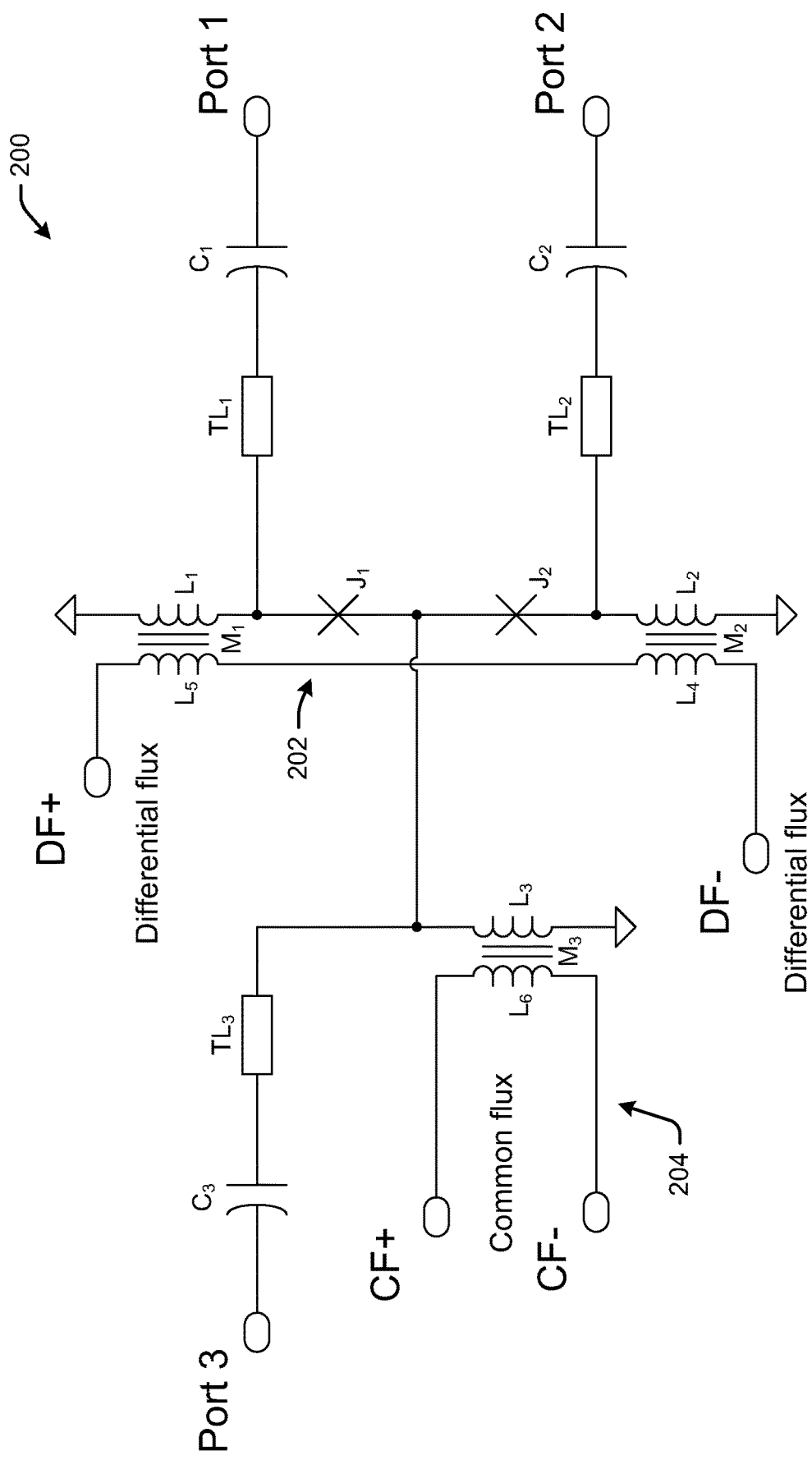
FIG. 2 is a circuit diagram of an example reconfigurable quantum router.

Performing quantum algorithms on a physical quantum processor can present a challenge when different circuit blocks, which can be remotely located on the chip, need to interact sequentially with another circuit block. This situation may arise, for example, in performing parity check operations on a logical level, or in state distillation routines on both physical and logical levels. One challenge of routing of quantum information is that "signal path" (i.e., the connectivity) of quantum objects must be reconfigurable in real time.

A 2-port, tunable bus-mediated coupling that uses a radio frequency superconducting quantum interference device (RF-SQUID) as a tunable coupling element embedded in the center point of a half-wave bus resonator is described in U.S. patent application publication No. 2017/0212860 A1, which disclosure is herein incorporated by reference. The effective coupling between a qubit connected to the Port 1 of the bus and a qubit connected to Port 2 of the bus is observable as a balance between two contributions (even and odd modes of the bus) having opposite signs and variable strengths. This coupling does not permit routing of quantum information between quantum objects, or for more than two quantum objects to be connected together to exchange information. Thus, even with such a coupling, connectivity between qubits is fixed in the design of the chip: although the strength of the coupling can be field-tunable, the topology of the circuit cannot be changed. As described herein, the sought-after real-time reconfigurability of quantum object connectivity can be provided with either or both of a single-pole double-throw switch and a cross-point switch.

Thus, this disclosure relates generally to reconfigurable quantum routing in superconducting circuits, for example, to provide reconfigurable connectivity between qubits or other quantum objects. This disclosure particularly provides both a single-pole double-throw switch and a cross-point switch for the connectivity configuration of a quantum circuit. In various examples, one or more variable inductance coupling elements are placed between qubits or other quantum objects that may reside in separate remote superconducting systems. The variable inductance coupling elements can each be adjusted between a strongly coupled state and a decoupled (or isolation) state between quantum objects in addition to various states of intermediate coupling strengths in between. In this manner, manipulation can be performed on state information of isolated qubits in a decoupled state, while this state information can be exchanged between qubits during a strongly coupled state, for example. Furthermore, state information can be manipulated and passed between qubits without destroying the state information of the originating qubit in an intermediate coupling strength state between qubits. In some examples, the variable inductance coupling elements can be Josephson junctions. Each variable inductance coupling element can be arranged as a single Josephson junction or a series array of N Josephson junctions, each having a critical current N times larger than the original (single) Josephson junction.

Some example reconfigurable quantum routers can include one or more Josephson junctions embedded at a dovetail node of a split half-wave resonator bus. The RF-SQUID facilitates bus-mediated dispersive interaction between connected qubits or other quantum objects for coupling. The advantage of bus-mediated coupling, as opposed to direct inductive coupling, is that the quantum objects can be physically placed remotely from each other, for example, in separate circuit blocks on the quantum processor chip. The advantage of a reconfigurable quantum router is that it permits signals to be routed between quantum objects as desired and at the coupling or interaction strengths desired. Thus, for example, interaction strengths can be calibrated and trimmed in the field to compensate for variability in manufacturing processes, and can be controlled in real time as part of a computation protocol.

FIG. 1A illustrates an example superconducting system 100 with reconfigurable quantum routing. The superconducting system 100 includes three or four quantum objects (e.g., qubits) 114, 116, 118, 120. As illustrated, one pair of quantum objects is connected on each side of router 102, but one side of router 102 may be connected to only one quantum object. Each quantum object can, for example, be part of a qubit system that belongs to a logical block that can perform different logical operations such as different gate operations, error correction operations, memory operations, or any of a variety of other superconducting operations. Connections between the quantum objects 114, 116, 118, 120 can be bus-mediated, allowing the quantum objects 114, 116, 118, 120 to reside at arbitrarily distant parts of a chip on which they are fabricated, for example. Router 102 thus couples or uncouples the quantum objects via a reconfigurable RF-SQUID bridge 104 (consisting, for example, of two or four RF-SQUIDs) and further via resonators (e.g., transmission lines) 106, 108, 110, 112. Router can thereby couple one quantum object (e.g., 114) to one of two other quantum objects (e.g., either of 118 or 120), as shown in FIG. 1B, or can couple two quantum objects (e.g., 114, 116) to two other quantum objects (e.g., 118, 120) in bar or cross fashions, as shown in FIGS. 1C and 1D, respectively. (In FIG. 1B, the two broken lines in router 102 indicate alternate couplings, whereas those in FIG. 1C indicate simultaneous couplings, as do those in FIG. 1D.)

Quantum router 102 can thus, for example, constitute a compound bus composed of three resonators (e.g., 106, 110, 112) and a two-Josephson-junction coupler 104, or of four resonators (106, 108, 110, 112) and a four-Josephson-junction coupler 104, in either case having bias elements 122 (e.g., a static flux bias and a control flux) to activate the switching functionality of the router 102. The system 100 can be implemented in any of a variety of superconducting circuit systems to provide coupling and decoupling between quantum objects. The signals between the coupled objects can be, for example, microwave signals that are implemented in a control scheme for a quantum circuit, such as performing a gate or a readout operation on a qubit, or to perform one of a variety of algorithms, such as those discussed herein. As another example, the signals can be a signal pulse, a communication signal, or a control command signal. The system 100 can operate at cryogenic temperatures, can dissipate substantially no power, and can be controlled with single flux quantum (SFQ) compatible signals.

System 100 can include a switch controller 124 and bias elements 122. The RF-SQUID bridge 104 can employ variable inductance coupling elements controlled by magnetic flux via the bias elements 122 and the switch controller 124 to couple and decouple connected quantum objects based on a selected mode (i.e., between either of the modes depicted in FIG. 1B, or between the modes separately depicted in FIGS. 1C and 1D, depending on the configuration of the router 102). The variable inductance coupling elements can each include, for example, one or more Josephson junctions. The one or more Josephson junctions can have a first inductance when no current or a low current is induced in the respective RF-SQUID, and a second inductance when a current or a higher current is induced in the respective RF-SQUID that is at a predetermined threshold that generates or induces a flux, for example, greater than about 0.1 $\Phi_0$ and less than about 0.45 $\Phi_0$, where $\Phi_0$ is equal to a flux quantum. The first such inductance (e.g., $\hbar/2eI_C$, where $\hbar$ is Planck's constant divided by $2\pi$, e is electron charge and $I_C$ is the critical current of the Josephson junction) can provide coupling between quantum objects, while the second such inductance (e.g., a large inductance value) can provide decoupling between the quantum objects.

FIG. 2 illustrates an example reconfigurable quantum router 200 arranged as a single-pole double-throw (SPDT)

reconfigurable bus coupler, which can function, for example, as a one-to-two multiplexer. Resonators $TL_1$, $TL_2$, and $TL_3$ are coupleable via respective capacitors $C_1$, $C_2$ and $C_3$ to quantum objects (e.g., qubits) that can be connected at Ports 1-3 respectively. Each resonator can support coupling to a plurality of qubits, either capacitively, as illustrated in FIG. 2, or inductively, or combination of both, as described in U.S. Pat. No. 9,501,748, which is herein incorporated by reference. Each of the resonators $TL_1$, $TL_2$, and $TL_3$ can be, for example, a quarter-wave shorted transmission line resonator, configured such that resonator $TL_1$ and $TL_2$ are both connected via RF-SQUID couplers to resonator $TL_3$. In the illustrated example, a first RF-SQUID is composed of Josephson junction $J_1$ connected to inductors $L_1$ and $L_3$ to form a first superconducting loop, and a second RF-SQUID is composed of Josephson junction $J_2$ connected to inductors $L_2$ and $L_3$ to form a second superconducting loop, where both loops share a common inductor $L_3$. The Josephson inductance of each of the Josephson junctions $J_1$ and $J_2$ is greater than the total linear inductance of the respective loops (i.e., $L_{J1} > L_1 + L_3$ and $L_{J2} > L_2 + L_3$).

Figure 3:
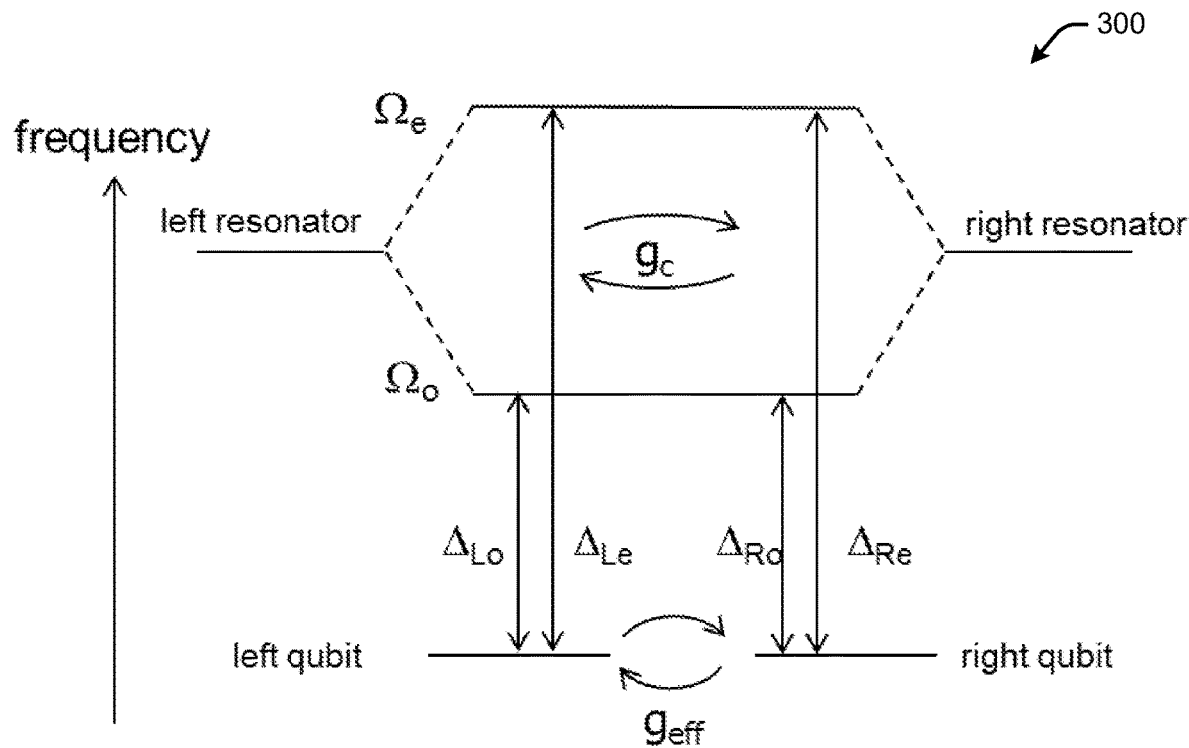
FIG. 3 is a diagram showing hybridized resonators producing frequency-split even and odd modes.

In circuit 200, Josephson junctions $J_1$ and $J_2$ function as variable inductance elements, as determined by the magnetic flux enclosed in each respective RF-SQUID loop. When an RF-SQUID encloses a flux $\Phi_{ON}$ that is substantially zero, the inductance of the junction in the RF-SQUID has a value equal to $\hbar/2eI_c$, where $\hbar$ is Planck's constant divided by $2\pi$, e is the electron charge, and $I_c$ is the junction critical current. When the RF-SQUID encloses a flux $\pm\Phi_{OFF}$ that is a significant fraction of $\pm\Phi_0/2$, e.g., greater than about 0.1 $\Phi_0$ and less than about 0.45 $\Phi_0$, the inductance of the junction diverges. Therefore, when the RF-SQUID formed by $J_1$, $L_1$, and $L_3$, encloses a flux $\Phi_{OFF}$, the coupling between resonators $TL_1$ and $TL_3$ is essentially zero, and the qubits connected to the respective resonators do not interact (e.g., they do not exchange information). However when the same RF-SQUID encloses a flux $\Phi_{ON}$, the resonators $TL_1$ and $TL_3$ become coupled with a coupling strength $g_c$, and hybridize to support two oscillation modes as shown in diagram 300 FIG. 3. The qubits that are connected to the respective resonators experience a non-zero effective coupling, $g_{eff}$ in FIG. 3. Similarly, the coupling between resonators $TL_2$ and $TL_3$ can be turned on or off based on a flux $\Phi_{ON}$ or $\Phi_{OFF}$ enclosed by the RF-SQUID formed by junction $J_2$ and inductors $L_2$ and $L_3$, and similarly the effective coupling between the qubits that connect to the respective resonators can be turned on or off.

The fluxes applied to the two RF-SQUIDs can be controlled via two flux-bias lines, indicated in FIG. 2 by differential flux line 202 (between nodes DF+ and DF−) and common flux line 204 (between nodes CF+ and CF−). A current flowing in the differential flux control line 202 induces a current in inductors $L_1$ and $L_2$ through respective mutual inductances $M_1$ and $M_2$. A current flowing in the common flux control line 204 induces a current in inductor $L_3$ through mutual inductance $M_3$. The current induced in inductor $L_3$ splits to flow through inductors $L_1$ and $L_2$ such that in one of the inductors the current adds to that induced by the differential flux control line, and in the other it subtracts. In other words, the two control currents can combine to produce any flux configuration in the two RF-SQUIDs. In particular, the common flux can be static and set at $(\Phi_{OFF}+\Phi_{ON})/2$ and the differential flux can be toggled between $(\Phi_{OFF}-\Phi_{ON})/2$ and $-(\Phi_{OFF}-\Phi_{ON})/2$, so that in a first configuration the first RF-SQUID encloses a total flux $\Phi_{ON}$ and the second RF-SQUID encloses a flux $\Phi_{OFF}$, whereas in a second configuration the first RF-SQUID encloses a flux $\Phi_{OFF}$ while the second RF-SQUID encloses a flux $\Phi_{ON}$. Therefore, in the first configuration qubits connected to $TL_3$ have an effective coupling to qubits connected to $TL_1$ (but not to qubits connected to $TL_2$), whereas in the second configuration the qubits connected to $TL_3$ have an effective coupling to those connected to $TL_2$ (but not to qubits connected to $TL_1$). The functionalities of common flux line 204 and differential flux line 202 can be interchanged, with differential line 202 being held static and common line 204 being toggled, to result in a circuit that functions similarly. In either case, because no net power is delivered between the ports, the functioning of circuit 200 differs from the actuation of a SPDT microwave switch to control delivery of microwave power in that circuit 200 can control an effective dispersive bus-mediated coupling between quantum objects without power delivery between ports.

Thus in an example functioning of circuit 200, two RF-SQUIDs commonly coupled by inductor $L_3$ can be provided common flux via line 204 that yields an induced current coming out of inductor $L_3$ that in turn is shared in opposite directions between Josephson junctions $J_1$ and $J_2$. Such current is therefore either contributorily added or subtracted from the current induced by differential flux line 202, which flows in the same direction through each of inductors $L_1$ and $L_2$. Thus, one of Josephson junctions $J_1$, $J_2$ is in a high inductance state while the other is in a low inductance state, the inductance states of the respective Josephson junctions being based entirely on the direction of the current flowing through differential flux line 202 in this example. Common flux current through line 204 stays steady, while differential flux current through line 202 is actuated in each of two directions, depending on the intended configuration of switch 202 to change the coupling between one of the qubits (for example) on one of Port 1 or Port 2 with the qubit (for example) on Port 3. However, as already noted, the roles of lines 202 and 204 are interchangeable.

Figure 4:
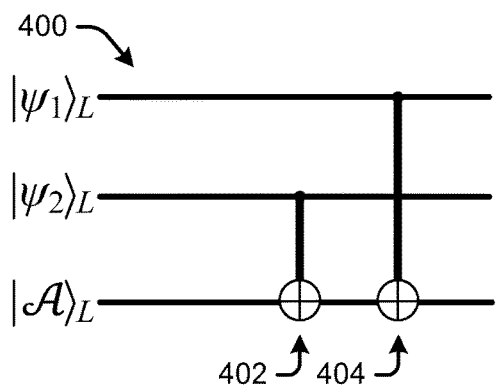
FIG. 4 is a logical-level quantum circuit illustration for a parity check operation between two logical qubits.
Figure 5:
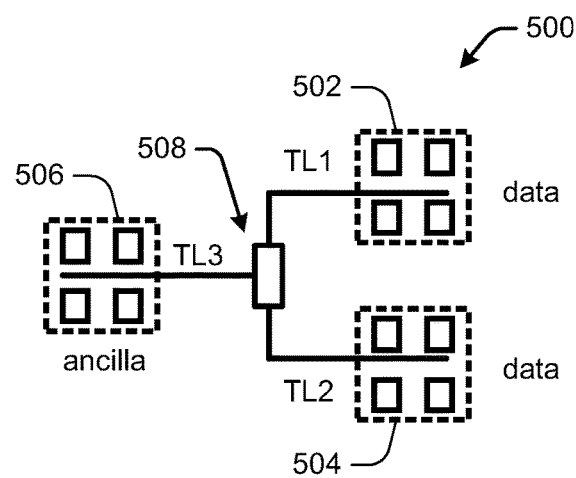
FIG. 5 is a quantum circuit segment illustration for the operation of FIG. 4.

FIGS. 4 and 5 together show an example of a logical-level quantum circuit that can use circuit 200 to provide reconfigurable quantum routing. Quantum circuit segment 500 in FIG. 5 performs a parity check operation between two logical qubits 502, 504, using a logical ancilla 506. Each of the logical qubits 502, 504 may be composed of an error-corrected collection of physical qubits, and as such may be located at a separate physical circuit block on a quantum processor chip. Circuit 200, with its dual RF-SQUID construction represented by circuit portion 508 in FIG. 5, allows for a remote connection (i.e., over a mm-scale distances) between the circuit blocks. The circuit 400 of FIG. 4 illustrates the sequence of connections. The first logical CNOT gate 402 corresponds to the control fluxes being configured such that the ancilla 506, whose physical qubits are connected to $TL_3$, is coupled via the RF-SQUIDs 508 to the second logical data qubit 504, whose physical qubits are connected to $TL_2$. After the function of the first CNOT gate 402 is performed, the control fluxes can be switched so that the first logical data qubit 502, whose physical qubits are connected to $TL_1$, is coupled to the ancilla 506 and the function of the second logical CNOT gate 404 can thereby be performed.

Figure 6:
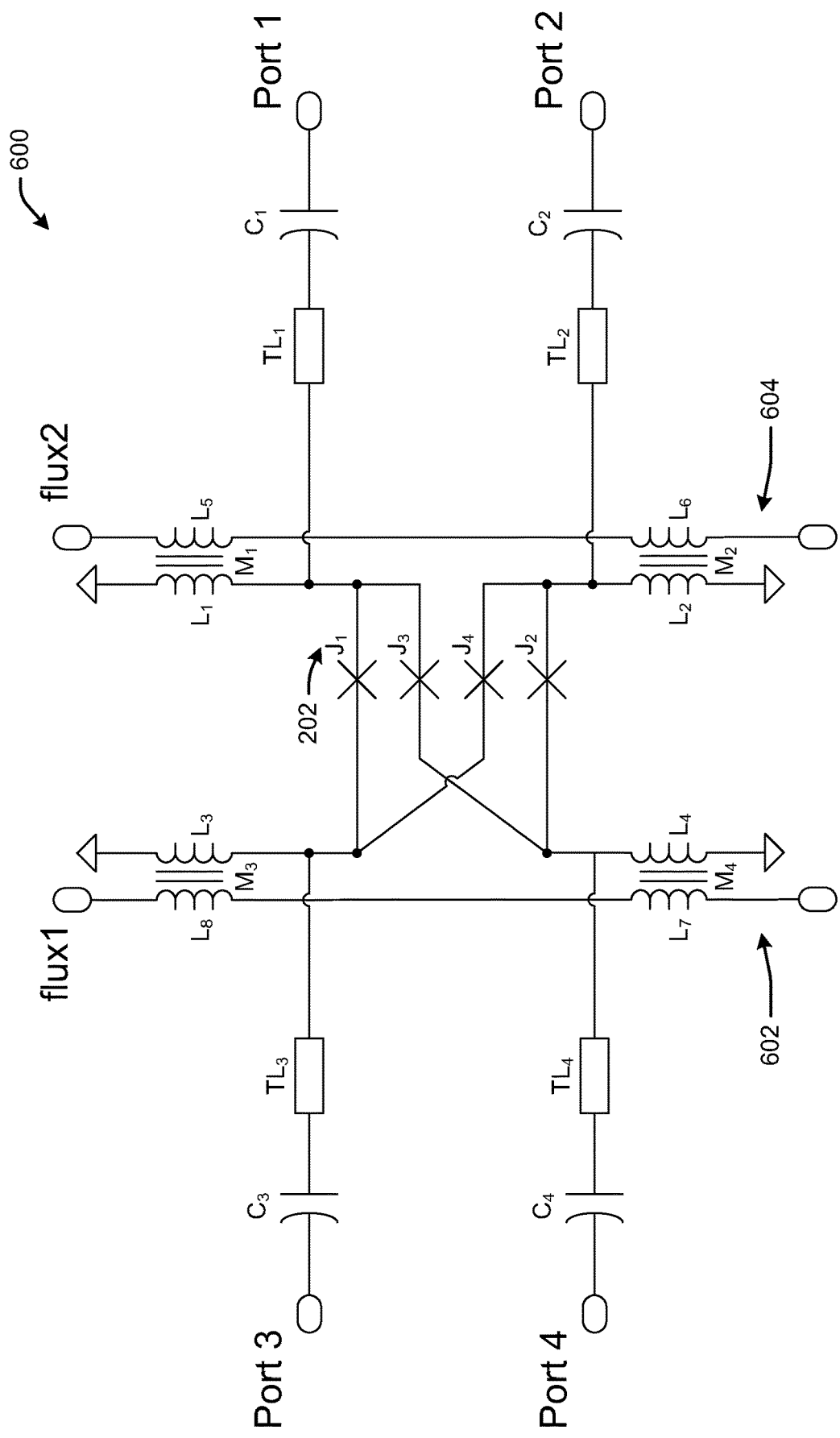
FIG. 6 is a circuit diagram of an example reconfigurable quantum router.

FIG. 6 illustrates another example reconfigurable quantum router 600 arranged as a cross-point reconfigurable bus coupler. Similar to reconfigurable quantum router 200 of FIG. 2, circuit 600 also uses RF-SQUIDs to couple resonators, in this case resonators $TL_1$, $TL_2$, $TL_3$, $TL_4$, which can be, for example, short-terminated quarter-wave resonators.

In the illustrated example, a first RF-SQUID is composed of Josephson junction $J_1$ connected to inductors $L_1$ and $L_3$ to form a first superconducting loop, a second RF-SQUID is composed of Josephson junction $J_2$ connected to inductors $L_2$ and $L_4$ to form a second superconducting loop, a third RF-SQUID is composed of Josephson junction $J_3$ connected to inductors $L_1$ and $L_4$ to form a third superconducting loop, and a fourth RF-SQUID is composed of Josephson junction $J_4$ connected to inductors $L_2$ and $L_3$ to form a fourth superconducting loop, where the first and third loops share a common inductor $L_1$, the second and fourth loops share a common inductor $L_2$, the first and fourth loops share a common inductor $L_3$, the second and third loops share a common inductor $L_4$. Circuit 600 is also controlled by two flux lines, flux1 602 and flux2 604, one of which can be configured as a static DC flux offset while the other is configured to be controlled in real time. Thus, for example, flux1 602 can serve as a common flux line while flux2 604 serves as a differential flux line, or vice versa.

Under the condition that equal magnitude currents flow in flux control lines 602, 604 in the same direction, the currents induced through Josephson junctions $J_1$ and $J_2$ cancel, while the currents through Josephson junctions $J_3$ and $J_4$ sum. The total currents induced through Josephson junctions $J_3$ and $J_4$ put these Josephson junctions in a high inductance state, causing the effective coupling between resonators $TL_4$ and $TL_1$, as well as between resonators $TL_3$ and $TL_2$, to vanish. Under such condition, since the currents in Josephson junctions $J_1$ and $J_4$ cancel, these Josephson junctions exhibit a low inductance state and there exists an appreciable effective coupling between resonators $TL_3$ and $TL_1$, as well as between resonators $TL_4$ and $TL_2$. This condition, wherein Ports 1 and 3 are coupled, Ports 2 and 4 are coupled, Ports 1 and 4 are uncoupled, and Ports 2 and 3 are uncoupled, may be referred to as a bar state.

Under the condition that equal magnitude currents flow in flux control lines 602, 604 in opposite directions, the induced currents will, by contrast, add on Josephson junctions $J_1$ and $J_2$ and cancel on Josephson junctions $J_3$ and $J_4$. In this configuration there exists an effective coupling between resonators $TL_3$ and $TL_2$ as well as between resonators $TL_4$ and $TL_1$, while the coupling between resonators $TL_3$ and $TL_1$, as well as between resonators $TL_4$ and $TL_2$, vanishes. This condition, wherein Ports 1 and 4 are coupled, Ports 2 and 3 are coupled, Ports 1 and 3 are uncoupled, and Ports 2 and 4 are uncoupled, may be referred to as a cross state.

Reconfigurable quantum router 600 in FIG. 6 therefore functions as a cross point reconfigurable bus that can selectively connect pairs of qubits (or groups of qubits) in response to two control currents having the same or opposite sign. Thus in an example of the functioning of circuit 600, when flux is provided in the same direction through lines 602, 604, pairs of RF-SQUIDs exhibit respective high or low inductance states to place the switch 600 in a bar configuration (as shown in FIG. 1C), while changing the polarity of one of the flux lines relative to the other alters the respective inductance states to place the switch 600 in a cross configuration (as shown in FIG. 1D). Thus, the Josephson junctions in the RF-SQUIDs of router 600 are switched in pairwise fashion.

Figure 7:
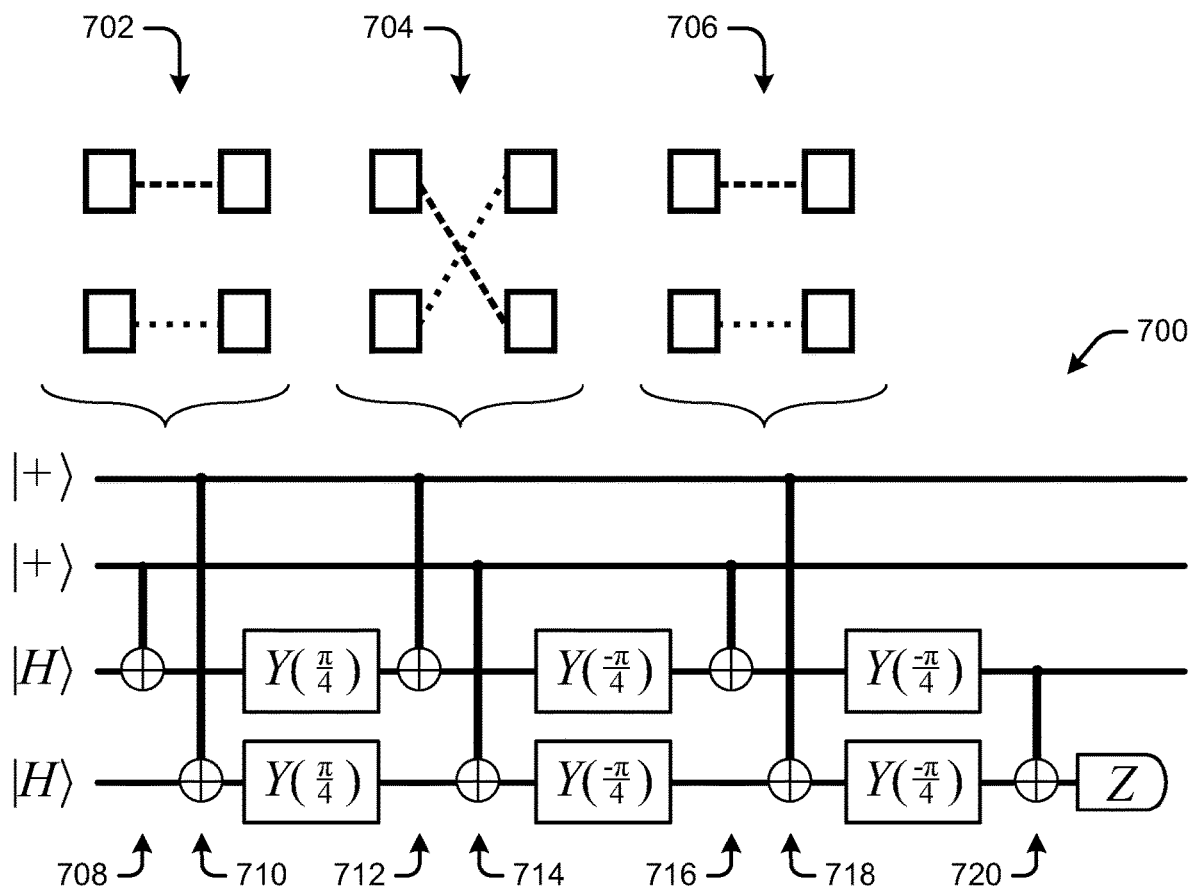
FIG. 7 is an annotated logical-level quantum circuit illustration for Toffoli distillation.

FIG. 7 illustrates an example quantum algorithm for which cross-point reconfigurable bus 600 may be applied. H-to-Toffoli distillation circuit 700 is shown in terms of the |H⟩-state implementation of Margolus-Toffoli gates. The algorithm uses pairwise CNOT gates 708/710, 712/714, 716/718 with alternating operands, where the circuit 600 facilitates the swapping of the operands as shown in FIG. 7. CNOT gates 708, 710 are achieved by bar state 702; CNOT gates 712, 714 are achieved by cross state 704; and CNOT gates 716, 718 are achieved by bar state 706. The last CNOT gate 720 in the algorithm can be achieved using a fixed coupling between member qubits. Performing the algorithm using circuit 600 alleviates complications that arise due to frequency crowding of the qubits and errors that may occur when qubit frequencies are swept across each other. Any algorithm that requires similar operand swapping can similarly benefit from the use of circuit 600.

Multiple of the switches 100, 200, 600 can be concatenated to create higher-connectivity configurations. For example, two "Port 3"s of second and third instances of router 200 could be connected, respectively, to Port 1 and Port two of a first instance of router 200 to result in a one-to-four multiplexer. As another example, multiple switches 600 could be connected to each other, or one or more routers 200 could be connected to one or more routers 600, extending the number of "input" and "output" ports and creating a greater variety of switching solutions. In such concatenated examples a single switch controller 124 could be configured to control the multiple bias elements 122 for multiple or all concatenated routers.

FIG. 8A shows an example method 800 of reconfigurable quantum routing. A static control signal is provided 802 to one of a common flux line that is inductively coupled to two RF-SQUIDs via a common inductor to induce a current split between first and second variable inductance coupling elements in the respective RF-SQUIDs, or a differential flux line that is inductively coupled to the two RF-SQUIDs via other inductors in each of the RF-SQUIDs to induce a current flowing unsplit through the first and second variable inductance coupling elements. A dynamic control signal is provided 804 to the other of the common flux line or the differential flux line, such that the difference between induced common flux current and induced dynamic flux current places 806 the first variable inductance coupling element (e.g., a first Josephson junction in the first RF-SQUID) in one of a high or low inductance state and places 806 the second variable inductance coupling element (e.g., a second Josephson junction in the second RF-SQUID) in the other of the high or low inductance state. The differential and common flux lines can be configured, for example, like lines 202 and 204 of circuit 200 shown in FIG. 2. The direction of the dynamic control signal (provided to one of the common flux line or the differential flux line) is actuated 808 to couple a first quantum object (e.g., a qubit) to either a second quantum object or a third quantum object, based on the dynamic control signal direction. Reconfigurable quantum routing is thereby achieved between the quantum objects.

FIG. 8B shows another example method 850 of reconfigurable quantum routing. A static control signal is provided 852 to one of a first flux line that is inductively coupled to first and second RF-SQUIDs via a common first inductor and third and fourth RF-SQUIDS via a common second inductor to induce currents split between first and second variable inductance coupling elements in the respective first and second RF-SQUIDs and between third and fourth variable inductance coupling elements in the respective third and fourth RF-SQUIDs, or a second flux line that is inductively coupled to the first and fourth RF SQUIDs via a common third inductor and the second and third RF-SQUIDs via a common fourth inductor to induce currents split between the first and fourth variable inductance coupling elements and between the second and third variable inductance coupling elements. A dynamic control signal is provided 854 to the other of the first flux line or the second flux line, such that the difference between induced first flux current and induced second flux current in each of the RF-SQUIDs places 856 two of the variable inductance coupling elements in one of a high or low inductance state and places 856 the other two variable inductance coupling elements in the other of the high or low inductance state. The first and second flux lines can be configured, for example, like lines 602 and 604 of circuit 600 shown in FIG. 6. The direction of the dynamic control signal is actuated 858 to couple a first quantum object (e.g., a qubit) to one of a second quantum object or a third quantum object and to couple a fourth quantum object to the other of the second quantum object or the third quantum object, based on the dynamic control signal direction. Reconfigurable quantum routing (in either "bar" or "cross" states) is thereby achieved between the quantum objects.

Figure 8C:
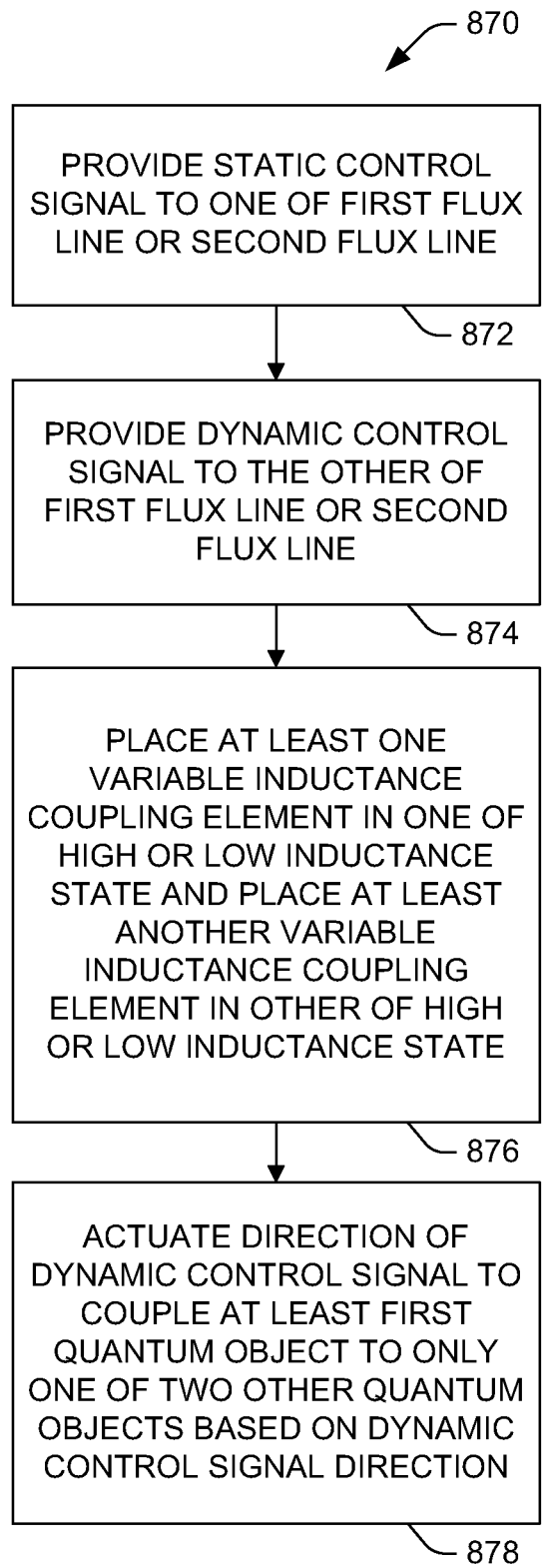

FIG. 8C shows an example method 870 of reconfigurable quantum routing. A static control signal is provided 872 to one of a first flux line that is inductively coupled to at least two RF-SQUIDs via at least one common inductor to induce at least one current split between variable inductance coupling elements in respective ones of the RF-SQUIDs, or a second flux line that is inductively coupled to the or another at least two RF-SQUIDs via other inductors in each of the RF-SQUIDs. A dynamic control signal is provided 874 to the other of the first flux line or the second flux line, such that the difference between induced common flux current and induced dynamic flux current places 876 at least one of the variable inductance coupling elements in one of a high or low inductance state and places 876 at least another of the variable inductance coupling elements in the other of the high or low inductance state. The first and second flux lines can be configured, for example, like lines 204 and 202 of circuit 200 shown in FIG. 2 or like lines 602 and 604 of circuit 600 shown in FIG. 6. The direction of the dynamic control signal is actuated 878 to couple at least a first quantum object (e.g., a qubit) to only one of at least two other quantum objects, based on the dynamic control signal direction. Reconfigurable quantum routing is thereby achieved between the quantum objects.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reconfigurable quantum router system comprising:
   first, second, and third quantum objects respectively connected to first, second, and third ports of a quantum router, the quantum router comprising:
   at least two variable-inductance coupling elements each in a respective RF-SQUID, at least two of the variable-inductance coupling elements being connected to at least one shared inductor such that the respective RF-SQUIDs of the at least two of the variable-inductance coupling elements share the shared inductor in common;
   first and second control flux lines, wherein the first control flux line is configured to inductively provide a static current to at least two of the variable-inductance coupling elements and the second control flux line is configured to provide a dynamic current to at least two of the variable-inductance coupling elements; and
   first, second, and third resonators by which the first, second, and third quantum objects are respectively each connected to at least a respective one of the RF-SQUIDs;
   wherein actuation of a direction of the dynamic current couples at least the first quantum object to only one of the second or third quantum objects based on the dynamic current direction to provide reconfigurable quantum routing.

2. The system of claim 1, wherein:
   the first quantum object is coupled to the second quantum object through the first resonator, a first of the variable-inductance coupling elements, and the second resonator; and
   the first quantum object is coupled to the third quantum object through the first resonator, a second of the variable-inductance coupling elements, and the third resonator.

3. The system of claim 2, wherein the quantum router is a single-pole double-throw (SPDT) reconfigurable bus coupler, and wherein the system further comprises a switch controller configured to control a setting of the quantum router between first and second switch states of a one-to-two multiplexer by changing the variable inductance coupling elements between opposing inductance states to allow selective routing of signals
   between the first port and the second port in the first switch state, and
   between the first port and the third port in the second switch state.

4. The system of claim 3, wherein the switch controller controls a polarity of current through the second current flux control line to alternate the reconfigurable quantum router system between the first switch state and the second switch state.

5. The system of claim 2, wherein the first, second, and third variable inductance coupling elements are each a series array of N Josephson junctions, each having a critical current N times larger than a single Josephson junction.

6. The system of claim 2, wherein:
   a fourth quantum object is coupled to the third quantum object through a fourth resonator, a third variable-inductance coupling element, and the third resonator; and
   the fourth quantum object is coupled to the second quantum object through the fourth resonator, a fourth variable-inductance element, and the second resonator.

7. The system of claim 6, wherein the quantum router is a cross-point reconfigurable bus coupler, and wherein the system further comprises a switch controller configured to control a setting of the quantum router between a bar state and a cross state of a cross-point switch by changing the variable inductance coupling elements between opposing inductance states to allow selective routing of signals
   between the first port and the second port and between the third port and the fourth port in the bar state, and between the first port and the third port and between the second port and the fourth port in the cross state.

8. The system of claim 7, wherein the switch controller controls a polarity of current through the second current flux control line to alternate the system between the bar state and the cross state.

9. The system of claim 6, wherein the first of the variable-inductance coupling elements is a first Josephson junction, the second of the variable-inductance coupling elements is a second Josephson junction, the third variable-inductance coupling element is a third Josephson junction and the fourth variable-inductance coupling element is a fourth Josephson junction.

10. A method of reconfigurable quantum routing comprising:
providing a static control signal to one of
a first flux line that is inductively coupled to two RF-SQUIDs via at least one common inductor to induce a current split between variable inductance coupling elements in respective ones of the RF-SQUIDs, or
a second flux line that is inductively coupled to the two RF SQUIDs or another two RF SQUIDs via other inductors;
providing a dynamic control signal to another of the first flux line or the second flux line, such that a difference between induced common flux current and induced dynamic flux current places at least one of the variable inductance coupling elements in one of a high or low inductance state and places at least another of the variable inductance coupling elements in another of the high or low inductance state;
actuating a direction of the dynamic control signal to couple at least a first quantum object to only one of at least two other quantum objects.

11. The method of claim 10, wherein the quantum objects are respectively coupled or uncoupled using a single-pole double-throw (SPDT) reconfigurable bus coupler.

12. The method of claim 11, wherein a first of the variable-inductance coupling elements is set to a low inductance, and a second of the variable-inductance coupling elements is set to a high inductance in a first switch state to couple the first quantum object to a second quantum object, and wherein the first of the variable-inductance coupling elements is set to a high inductance, and the second of the variable-inductance coupling elements is set to a low inductance in a second switch state to couple the first quantum object to a third quantum object.

13. The method of claim 10, wherein the quantum objects are respectively coupled or uncoupled using a cross-point reconfigurable bus coupler.

14. The method of claim 13, wherein a first and a third variable inductance coupling elements are set to a low inductance and a second and a fourth variable inductance coupling elements are set to a high inductance in a bar state to couple the first quantum object with the second quantum object and the third quantum object with the fourth quantum object, and wherein the first and third variable inductance coupling elements are set to a high inductance, and the second and fourth variable inductance coupling elements are set to a low inductance in a cross state to couple the first quantum object with the third quantum object and the second quantum object with the fourth quantum object.

15. The method of claim 10, wherein the coupled quantum objects are each connected to respective ones of the RF-SQUIDs by quarter-wave shorted transmission line resonators.

16. A reconfigurable quantum router comprising:
first, second, and third ports each coupleable to respective first, second, and third qubits;
first, second, and third resonators each respectively connected between the first, second, and third ports and an RF-SQUID bridge, the RF-SQUID bridge comprising:
a first Josephson junction connected between the first resonator and the second resonator; and
a second Josephson junction connected between the first resonator and the third resonator; and
first and second flux lines arranged to switch respective inductances of the first and second Josephson junctions between high and low inductance states to selectively couple or uncouple qubits connected to the ports.

17. The system of claim 16, wherein the resonators are quarter-wave shorted transmission line resonators.

18. The system of claim 17, further comprising:
a fourth port coupleable to a respective fourth qubit;
a fourth resonator connected between the fourth port and the RF-SQUID bridge, the RF-SQUID bridge further comprising:
a third Josephson junction connected between the fourth resonator and the third resonator; and
a fourth Josephson junction connected between the second resonator and the fourth resonator;
wherein the first and second flux lines are arranged to switch respective inductances of the first, second, third, and fourth Josephson junctions in pairwise fashion between high and low inductance states, with the first and third Josephson junctions being the same state as each other and the second and fourth Josephson junctions being the same state as each other and the opposing state of the first and third Josephson junctions, to selectively couple or uncouple qubits connected to the ports.

19. The system of claim 16, further comprising a switch controller configured to control a direction of current through one of the flux lines to adjust inductance states of the Josephson junctions and thereby switch between qubit coupling states.

20. The system of claim 16, further comprising at least first, second, and third coupling capacitors respectively arranged between respective ones of the first, second, and third resonators and respective ones of the first, second, and third ports.

* * * * *